US010295742B2

(12) United States Patent
Hassan et al.

(10) Patent No.: US 10,295,742 B2
(45) Date of Patent: May 21, 2019

(54) GUIDED LIGHT SOURCE FOR EMISSION OF SINGLE PHOTONS

(71) Applicant: COMMISSARIAT A L'ENERGIE ATOMIQUE ET AUX ENERGIES ALTERNATIVES, Paris (FR)

(72) Inventors: Karim Hassan, Moneteau (FR); Salim Boutami, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/978,481

(22) Filed: May 14, 2018

(65) Prior Publication Data
US 2018/0335568 A1   Nov. 22, 2018

(30) Foreign Application Priority Data

May 18, 2017 (FR) ..................... 17 54421

(51) Int. Cl.
*G02B 6/12* (2006.01)
*H01L 33/06* (2010.01)
(Continued)

(52) U.S. Cl.
CPC ......... *G02B 6/124* (2013.01); *G02B 6/12004* (2013.01); *G02B 6/136* (2013.01);
(Continued)

(58) Field of Classification Search
CPC ............... G02B 6/124; G02B 6/136; G02B 2006/12061; G02B 2006/1209;
(Continued)

(56) References Cited

U.S. PATENT DOCUMENTS 5,263,111 A * 11/1993 Nurse ................ G02B 6/12002
385/130
5,327,215 A * 7/1994 Bernard ............... G01C 19/725
356/461
(Continued)

FOREIGN PATENT DOCUMENTS

FR     2993816 A1     1/2014

OTHER PUBLICATIONS

Claudon et al., "A highly efficient single-photon source based on a quantum dot in a photonic wire," Nature Photonics 4, (Mar. 2010): 174-177.
(Continued)

*Primary Examiner* — Akm E Ullah
(74) *Attorney, Agent, or Firm* — Pearne & Gordon LLP

(57) ABSTRACT

A guided light source that comprises: at least one quantum box associated with a discoid wave guide to achieve cylindrical propagation of a wave front emitted by the at least one quantum box in the discoid wave guide; an annular wave guide surrounding the discoid wave guide and having a grating coupler formed on its internal periphery to receive the wave front in normal incidence; an output wave guide optically coupled to the annular wave guide, in which the wave front is guided. The invention includes the method of fabrication of such a source, and its use for emission of a sequence of single photons.

14 Claims, 3 Drawing Sheets

(51) Int. Cl.
  *H01S 5/10* (2006.01)
  *G02B 6/124* (2006.01)
  *G02B 6/136* (2006.01)
  *H01L 33/46* (2010.01)
  *H01L 33/62* (2010.01)
  *H01S 5/12* (2006.01)
  *H01S 5/34* (2006.01)
  *H04B 10/70* (2013.01)

(52) U.S. Cl.
  CPC .............. *H01L 33/06* (2013.01); *H01L 33/46* (2013.01); *H01L 33/62* (2013.01); *H01S 5/1032* (2013.01); *H01S 5/1237* (2013.01); *H01S 5/3412* (2013.01); *H04B 10/70* (2013.01); *G02B 2006/1209* (2013.01); *G02B 2006/12061* (2013.01); *G02B 2006/12097* (2013.01); *G02B 2006/12104* (2013.01); *G02B 2006/12107* (2013.01); *G02B 2006/12123* (2013.01); *G02B 2006/12147* (2013.01); *H01L 2933/0025* (2013.01); *H01L 2933/0066* (2013.01)

(58) Field of Classification Search
  CPC ........... G02B 2006/12104; G02B 2006/12107; G02B 2006/12123; G02B 2006/12147; H01L 33/06; H01L 33/46; H01L 33/62
  See application file for complete search history.

(56) References Cited

U.S. PATENT DOCUMENTS

| | | | | |
|---|---|---|---|---|
| 5,444,802 A * | 8/1995 | Shibata | ............... | G02F 1/3521 385/16 |
| 5,790,583 A * | 8/1998 | Ho | ............... | B82Y 20/00 372/108 |
| 5,878,071 A * | 3/1999 | Delavaux | ............... | H01S 3/1109 372/10 |
| 6,522,462 B2 * | 2/2003 | Chu | ............... | G02F 2/004 359/344 |
| 6,522,793 B1 * | 2/2003 | Szilagyi | ............... | G02F 1/225 385/1 |
| 6,795,616 B2 * | 9/2004 | Yao | ............... | G02B 6/02071 385/24 |
| 7,136,544 B1 * | 11/2006 | Gunn, III | ............... | G02B 6/12004 385/3 |
| 7,657,139 B2 * | 2/2010 | Chen | ............... | G02F 1/035 385/15 |
| 9,112,082 B2 * | 8/2015 | Gregersen | ............... | H01L 33/06 |
| 9,568,750 B2 * | 2/2017 | Spann | ............... | G02F 1/025 |
| 9,823,076 B2 * | 11/2017 | Guattari | ............... | G01C 19/728 |
| 10,126,501 B2 * | 11/2018 | Van Orden | ............... | G02B 6/26 |
| 10,162,199 B2 * | 12/2018 | Zheng | ............... | G02F 1/011 |
| 2006/0284192 A1 * | 12/2006 | Butendeich | ............... | H01L 33/02 257/86 |
| 2008/0096308 A1 | 4/2008 | Santori et al. | | |
| 2011/0176779 A1 * | 7/2011 | Kolesar | ............... | G02B 6/4249 385/77 |
| 2013/0092897 A1 * | 4/2013 | Shambat | ............... | H01L 33/04 257/13 |
| 2014/0049812 A1 | 2/2014 | Palanchoke et al. | | |
| 2015/0055991 A1 * | 2/2015 | Hashimoto | ............... | G03G 15/0812 399/284 |
| 2015/0226918 A1 * | 8/2015 | Bauters | ............... | H01L 31/105 385/14 |
| 2015/0285737 A1 | 10/2015 | Gliere et al. | | |
| 2015/0331192 A1 * | 11/2015 | Hall | ............... | G02B 6/3885 385/24 |
| 2016/0091676 A1 | 3/2016 | Favreau et al. | | |
| 2016/0124145 A1 | 5/2016 | Hassan et al. | | |
| 2016/0299292 A1 | 10/2016 | Hassan et al. | | |
| 2016/0377815 A1 * | 12/2016 | Ma | ............... | G02B 6/29344 385/14 |
| 2017/0097301 A1 | 4/2017 | Lefebvre et al. | | |
| 2017/0102323 A1 | 4/2017 | Boutami et al. | | |
| 2018/0039024 A1 | 2/2018 | Boutami et al. | | |

OTHER PUBLICATIONS

Unitt et al., "Quantum dots as single-photon sources for quantum information processing," Journal of Optics B: Quantum and Semi-classical Optics 7, (2005): S129-S134.

U.S. Appl. No. 15/867,215; entitled "Source of Collimated Light, the Method for producing Same and Use of Same for the Emission of Single Photons," filed Jan. 10, 2018.

Preliminary French Search Report for Application No. FR 1754421, dated Feb. 21, 2018.

* cited by examiner

FIG.3dii

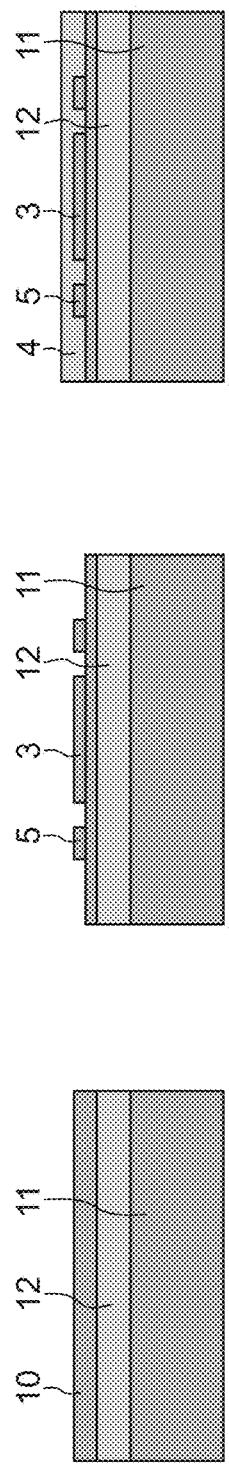
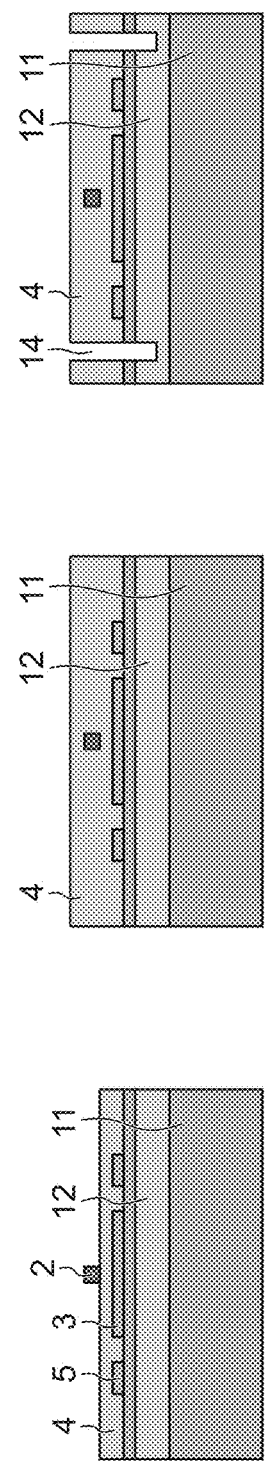
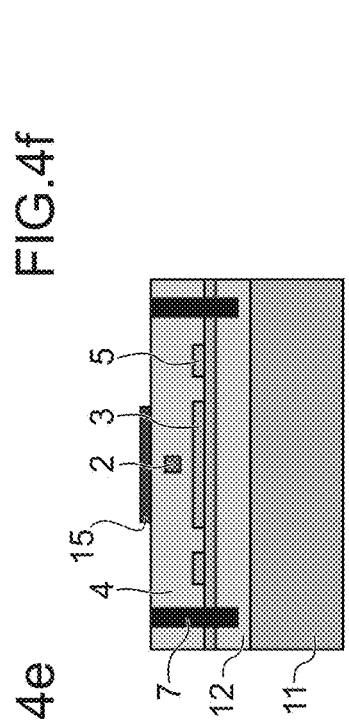
FIG.4a  FIG.4b  FIG.4c
FIG.4d  FIG.4e  FIG.4f
FIG.4g  FIG.4h

GUIDED LIGHT SOURCE FOR EMISSION OF SINGLE PHOTONS

CROSS-REFERENCE TO RELATED APPLICATIONS

This application claims priority from French Patent Application No. 17 54421 filed on May 18, 2017. The content of this application is incorporated herein by reference in its entirety.

TECHNICAL DOMAIN

The domain of the invention is light sources, and more particularly single-photon sources.

STATE OF PRIOR ART

Single-photon sources are capable of emitting a single photon at a time. They are generally composed of a quantum box type emitter, and the emission of a photon from the emitter is made from an injected electron-hole pair.

These sources are useful for the fundamental study of optical and quantum processes, and also for quantum cryptography. If we can transmit information in bits in which each bit is composed of a single-photon, we can guard against or at least detect the interception of messages.

If a single-photon source is to be usable, it must be possible to efficiently collect the emitted photon. To achieve this, the source must be capable of emitting the photon directionally.

A well-known single-photon source is described in the article "Quantum dots as single-photon sources for quantum information processing» (D C Unitt et al 2005 *J. Opt. B: Quantum Semiclass. Opt.* 7 S129). It is composed of a pillar formed by reactive ion etching, with a quantum box within it surrounded by Bragg mirrors. The Bragg mirrors make it possible to form a Fabry-Perot cavity that exacerbates the probability of emission from the quantum box in this resonance mode. However, it is found that this type of source diverges. Furthermore, due to the strong resonance of this source (long lifetime of the photon emitted in the cavity), there is a risk that the photon is diffracted by the edge roughness of the pillar etching.

Another type of single-photon source is presented in the article "A highly efficient single-photon source based on a quantum dot in a photonic nanowire" (J. Claudon et al., Nature Photonics 4, 174-177 (2010)). This source is in the form of a pillar, the top tip of which is sharpened by appropriate etching conditions. A mirror is placed under the pillar to reflect light upwards. This source is only slightly resonant, so that light is not diffracted by roughness. Moreover, sharpening of the tip at the top of the pillar can spatially widen the mode of the pillar, and therefore reduce its angular divergence. Therefore this source has good emission directivity.

However, the positioning of the quantum box within a pillar requires precise alignment, that is not easy. It is also difficult to precisely control the shape of the tip of the pillar, such that collimation of the source cannot be well controlled.

PRESENTATION OF THE INVENTION

One purpose of the invention is to disclose a light source that does not have these disadvantages. To achieve this, the invention discloses a light source that emits in a guided manner rather than in free field. More particularly, the invention discloses a guided light source comprising at least one quantum box associated with a discoid wave guide to achieve cylindrical propagation of a wave front emitted by the at least one quantum box in the discoid wave guide. An annular wave guide surrounds the discoid wave guide and has a grating coupler (T) formed on its internal periphery to receive said wave front in normal incidence. An output wave guide is optically coupled to the annular wave guide.

Some preferred but non-limitative aspects of this source are as follows:
- the annular wave guide is open to form two coupling ends, and the source also comprises a coupler connected firstly to the two coupling ends of the annular wave guide and secondly to the output wave guide, said coupler being configured to combine beams circulating in the inverse direction in the annular wave guide into a single beam circulating in the output wave guide;
- the coupler is a Y junction, or a multimode interference coupler;
- a mirror surrounds the annular wave guide, for example at a quarter wavelength optical distance from the annular wave guide
- the discoid wave guide and the annular wave guide are separated from each other by an optical distance less than a quarter wavelength distance;
- the at least one quantum box is arranged in the discoid wave guide or is separated from the discoid wave guide by an optical distance less than a quarter wave distance;
- the annular wave guide is made of a doped semiconductor material;
- the annular wave guide is a rib wave guide;
- an electrical contact pad is arranged above the at least one quantum box;
- it comprises a single quantum box.

The invention includes the use of this source for emission of a sequence of single-photons, for example in a quantum cryptography process. The invention also relates to a method of fabricating such a guided light source.

BRIEF DESCRIPTION OF THE DRAWINGS

Other aspects, purposes, advantages and characteristics of the invention will be better understood after reading the detailed description given below of preferred embodiments of the invention, given as non-limitative examples, with reference to the appended drawings on which:

FIGS. 4a-4h illustrate a second example of a method of fabricating a source according to the invention.

DETAILED PRESENTATION OF PARTICULAR EMBODIMENTS

The invention relates to a guided light source, for example a source that will emit a sequence of single photons.

Figure 1:
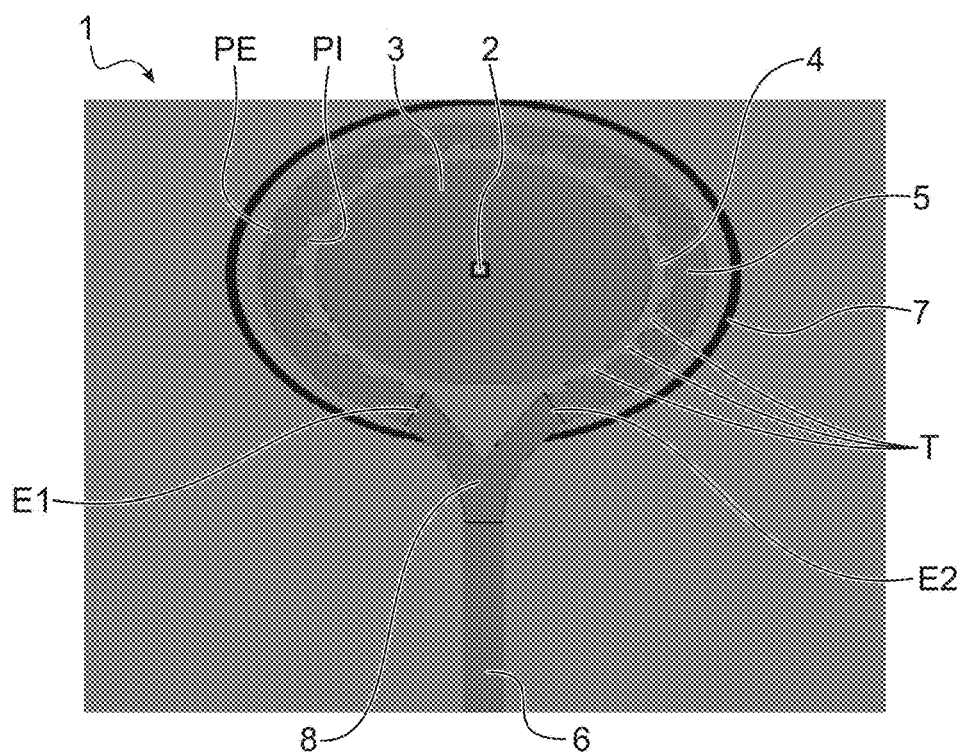
FIG. 1 is a top view of a guided light source according to one possible embodiment of the invention.

FIG. 1 shows a top view of a source 1 according to the invention. It comprises at least one quantum box 2 associated with a discoid wave guide 3 to achieve cylindrical propagation of a wave front emitted by the at least one quantum box in the discoid wave guide. The discoid wave guide is made from a core material, for example it is made of silicon. It is surrounded by a cladding for example made of silicon.

The discoid wave guide 3 is in the form of a block with a globally circular section. It has an axis of symmetry shown as reference A on FIG. 3b. Its cross-section in a plane orthogonal to the axis of symmetry, is in the form of an ellipse in which the ratio between the small and large radii is between 0.8 and 1. The axis of symmetry passes through the centre of the ellipse. For example, the discoid wave guide may be 3 μm thick. It may have a circular cross-section with a diameter equal for example to 3.5 μm, in which case it forms a cylinder.

The quantum box(es) 2 is (are) arranged below or above (as is the case in FIG. 1) or inside the discoid wave guide 3. Ideally, they are placed at the axis of symmetry. The wave front produced by a quantum box propagates a cylindrical manner in the discoid wave guide, from the axis of symmetry towards the periphery of the discoid wave guide.

When positioned below or above the discoid wave guide, a quantum box is in contact with the discoid wave guide or is separated from it by a distance less than a quarter wave optical distance.

The source 1 may comprise a single quantum box that then forms a single-photon source. It may comprise a plurality of quantum boxes arranged in the form of an organised aggregate or set of quantum boxes.

The source 1 also comprises an annular wave guide 5 that surrounds the discoid wave guide 3, and is separated from it by the cladding 4 by an optical distance not more than a quarter wavelength to avoid vertical light losses. The annular wave guide 5 has an external periphery PE (lateral face), an internal periphery PI facing the discoid wave guide 3 and an upper surface connecting the external and internal peripheries. It advantageously has the same thickness as the discoid wave guide, and a width for example equal to 0.5 μm.

A grating coupler is formed on the internal periphery PI of the annular wave guide 5. Such a grating is generally made on the upper surface of a wave guide to enable extraction (or injection) of light from (to) the wave guide to (from) an optical fibre. The efficiency can be increased if this extraction/injection takes place at an angle Θ relative to the normal to the grating, by inclining the optical fibre. The period of the grating is then expressed by $$P = \frac{\lambda}{n_{eff} - n \sin \theta}$$

where $n_{eff}$ is the effective index of the mode, n is the index of the superstrate, and θ is the injection or extraction angle.

In the framework of the invention, the grating coupler comprises a series of trenches T etched through the entire thickness of the annular wave guide, along the internal periphery. The coupler grating thus formed on the internal periphery of the annular guide 5 receives the wave front that is propagated in a cylindrical manner in the discoid wave guide 3, with normal incidence. Therefore Θ=0° and the grating is designed to have a period $$P = \frac{\lambda}{n_{eff}}.$$

One example embodiment is a silicon guide surrounded by silica, a working wavelength λ=1.55 μm, a grating periodicity P=530 nm, a filling factor of 50% and a 90 nm etching depth (from the internal lateral face of the wave guide).

With normal injection, for symmetry reasons, 50% of light injected in the annular wave guide 5 goes in one direction and 50% goes in the other direction, with the same phase. Thus, when the quantum box emits a wave, light is injected normally into the annular wave guide 5 in which it propagates according to two modes: a propagation mode in the direction of the ring and a counter-propagation mode in the opposite direction.

The light source 1 also comprises an output wave guide 6 optically coupled to the annular wave guide, for example a straight guide. Thus light emitted by the quantum box(es) is coupled in the output guide, thus making a guided light source.

Preferably, the light source also comprises a mirror 7 that surrounds the annular wave guide to return light towards the annular wave guide. The mirror 7 is placed at an optical distance of a quarter wavelength from the external periphery of the annular wave guide and is separated from it by cladding material, typically silica. The mirror may be formed from metal (for example copper, gold, titanium, tungsten or indium-tin oxide), and thus form a metallic chamber to assure that light does not escape from the source. In one variant embodiment, the mirror is a Bragg mirror composed of a radial alternation of layers with different optical indexes, for example silica and silicon layers.

In one embodiment, and as shown on FIG. 1, the annular wave guide 5 is open to form two coupling ends E1, E2 (it is partially annular, and preferably covers at least 75% of the circumference of a ring). The two coupling ends E1, E2 are preferably symmetric about a median sagittal plane of the ring (plane orthogonal to the plane of FIG. 1 and containing the axis of symmetry). The grating coupler extends from one coupling end to the other along the internal periphery of the annular wave guide-.

The source also comprises a coupler 8 with 2 inputs and 1 output connected firstly to the two coupling ends E1, E2 of the annular wave guide 5, and secondly to the output wave guide, said coupler 8 being configured to combine the beams circulating in the inverse direction in the annular wave guide into a single beam circulating in the output wave guide. In other words, the coupler 8 makes it possible to recombine the two modes (propagative and counter-propagative) circulating in the annular wave guide, in the output wave guide. The coupler 8 can be a Y junction, or a MultiMode Interference (MMI) coupler.

In one variant embodiment, the annular wave guide is perfectly annular and is coupled in an evanescent manner to a straight wave guide. In such a case, light circulates in the two modes (propagation and counter-propagation), in the straight guide. A coupler with two inputs, each connected to one end of the straight wave guide, and one output connected to an output wave guide, combines beams circulating in the inverse direction in the straight wave guide into a single beam circulating in the output wave guide.

In another embodiment that does not use a coupler, one of the coupling ends of the annular wave guide is connected to the output wave guide while a mirror is placed at the other coupling end.

Figure 2:
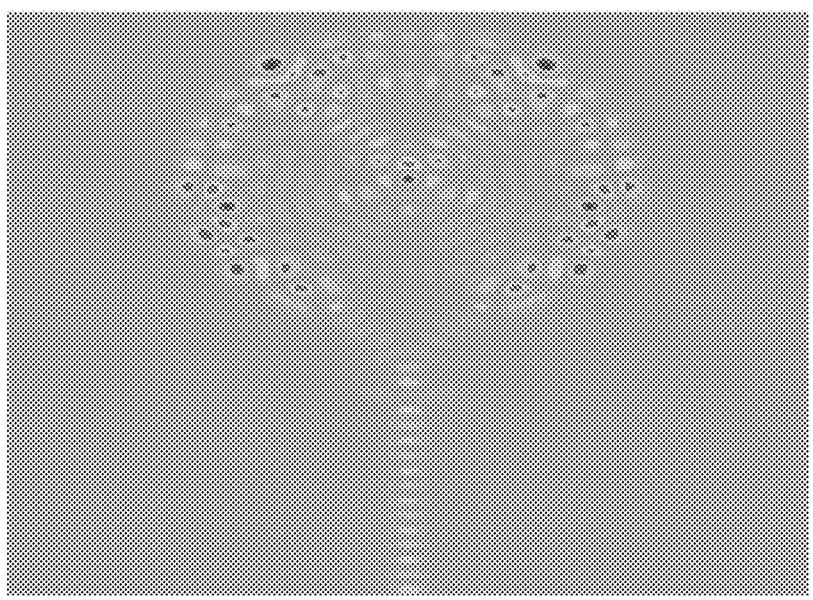
FIG. 2 is a diagram illustrating propagation of a wave front emitted by a quantum box in the source in FIG. 1.

FIG. 2 shows a simulation of the guided light source in FIG. 1, by a finite differences calculation in the time domain, at the telecom wavelength of λ=1.55 μm. This simulation confirms good optical coupling with the output guide 6 because 80% of light emitted by the quantum box is guided into the output wave guide.

Figure 3A:
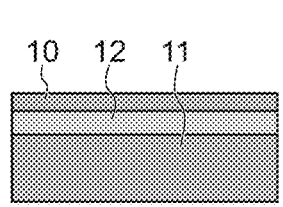
FIGS. 3a-3g illustrate a first example of a method of fabricating a source according to the invention.
Figure 3B:
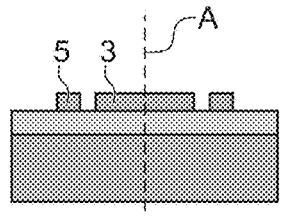
Figure 3C:
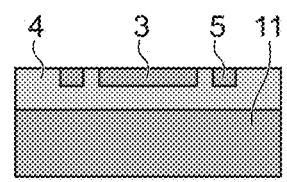

FIGS. 3a-3g show a first example embodiment of a method of fabricating a guided light source according to the invention. The method begins (FIG. 3a) with the supply of a Silicon On Insulator (SOI) substrate that comprises a silicon surface layer 10 separated from a solid silicon substrate 11 by a buried oxide layer 12. With reference to FIG. 3b, the silicon surface layer 10 is etched to define the different structures of the guided light source, namely the discoid wave guide 3, the annular wave guide 5 of which the internal periphery is etched to define the grating coupler, the output wave guide, the coupler and possibly the silicon layers in which a Bragg mirror will be formed. With reference to FIG. 3c, the core material (in this case silica) is deposited, and this deposit is then planarised. The next step is to position the quantum box(es) 2 at the centre of the discoid wave guide, for example by depositing a colloidal solution of quantum boxes on the substrate.

Figure 3D:
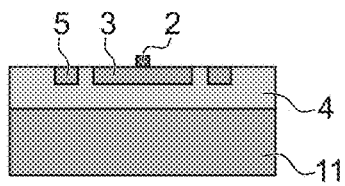
Figure 3D:
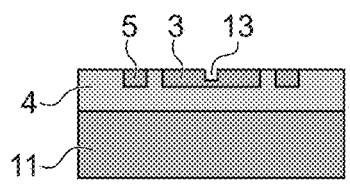

In one variant illustrated on FIG. 3d, a quantum box is deposited on the discoid wave guide 3 at the axis of symmetry A. In one variant not illustrated, a resin can be deposited on the structure in FIG. 3c and etched vertically in line with the discoid wave guide 3 at the axis of symmetry A. A quantum box is then positioned in the hole etched in the resin, by capillarity. The resin is then removed to lead to a structure identical to that shown on FIG. 3d. In another variant embodiment illustrated on FIGS. 3di and 3dii, the discoid wave guide 3 is etched to form a hole in it on the axis of symmetry. The quantum box 2 naturally moves into the hole, by capillarity.

Figure 3E:
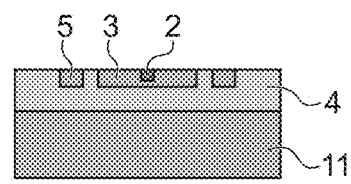
Figure 3E:
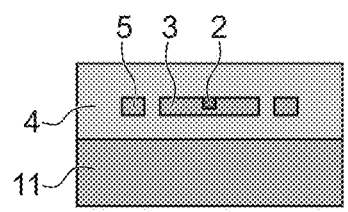
Figure 3F:
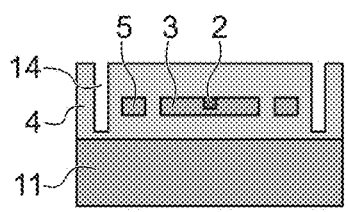
Figure 3G:
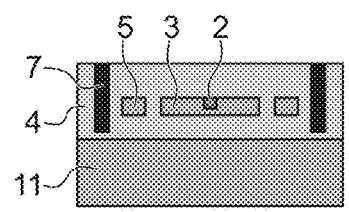

The next step is to make a new silica deposit to encapsulate the set of wave guides with cladding material (FIG. 3e). When a metal mirror is used, a trench 14 is etched surrounding the annular wave guide 5 (FIG. 3f), and the trench is then filled (or its walls are simply plated) by a metal 7 (FIG. 3g), for example copper. The metal present on the surface after said deposit can then be eliminated or it can be kept.

FIGS. 4a-4h show a second example embodiment of a method of fabricating a guided light source according to the invention. This second example embodiment makes electrical pumping rather than optical pumping possible, to excite the quantum box by means of electrical injection by the tunnel effect so that a photon can be emitted.

This method begins (FIG. 4a) with the supply of an SOI substrate in which the surface layer 10 is doped. With reference to FIG. 4b, the silicon surface layer is etched to define the different structures of the guided light source, namely the discoid wave guide 3, the annular wave guide 5 of which the internal periphery is etched to define the grating coupler, the output wave guide and the coupler. In this case, the discoid wave guide is a rib wave guide so that an electrical contact can be made. The next step is to deposit a thin layer of silica 4 (FIG. 4c) and then to position the quantum box (FIG. 4d), possibly with prestructuring of the silica or a resin layer to facilitate this positioning. A new silica deposit (FIG. 4e) is made, a trench 14 is etched surrounding the annular wave guide (FIG. 4f), the trench is filled by a metal to form the mirror 7 (FIG. 4g) and finally an upper electrical contact pad 15 is formed above the quantum box (FIG. 4h). The metal mirror 7 in contact with the doped rib discoid wave guide enables electrical contact. These electrical contacts (pad 15 and contact made through the mirror 7) enable an electrical injection into the box, the current being unable to pass from the pad 15 to the discoid wave guide due to the dielectric layer 4, except through the quantum box by the tunnel effect. By thus forcing the current to pass through the box, good injection efficiency is assured, the injection of an electron-hole pair enabling the emission of a photon.

The invention also applies to the use of the source as described above for emission of a sequence of single photons.

The device can then be composed of a pulsed pump laser and a pair of two APD (avalanche photodiode) type fast detectors coupled to a pulse counter to measure the correlation function. The two detectors are located on opposite sides of a semi-reflecting plate receiving the photon flow from the sample excited by the laser. In one alternative embodiment to optical pumping, and as described above, an electrical injection can be made by tunnel effect in the quantum box.

The invention is not limited to the guided light source and its use, but also includes a photonic circuit integrating such a light source and a method of fabricating such a source and particularly a method of fabricating a guided light source, including:

the formation of a discoid wave guide 3, an annular wave guide 5 surrounding the discoid wave guide and an output wave guide 6 optically coupled to the annular wave guide;

placement of at least one quantum box 2 to achieve cylindrical propagation of a wave front emitted by the at least one quantum box in the discoid wave guide; and formation of a grating coupler on an internal periphery PI of the annular wave guide 5 to receive said wave front in normal incidence.

The invention claimed is:

1. A guided light source, comprising:
    at least one quantum box associated with a discoid wave guide to achieve cylindrical propagation of a wave front emitted by the at least one quantum box in the discoid wave guide;
    an annular wave guide surrounding said discoid wave guide, having a grating coupler formed on its internal periphery to receive said wave front in normal incidence and being open at two coupling ends;
    an output wave guide optically coupled to the annular wave guide; and
    a coupler having a first side connected to the two coupling ends of the annular wave guide and a second side connected to the output wave guide, said coupler being configured to combine a beam circulating in the annular wave guide in a propagation mode and a beam circulating in the annular wave guide in a counter-propagation mode into a single beam circulating in the output wave guide.

2. The guided light source according to claim 1, in which the coupler is a Y junction.

3. The guided light source according to claim 1, in which the coupler is a multimode interference coupler.

4. The guided light source according to claim 1, further comprising a mirror that surrounds the annular wave guide.

5. The guided light source according to claim 4, in which the mirror is arranged at a quarter wave optical distance from the annular wave guide.

6. The guided light source according to claim 1, in which the discoid wave guide and the annular wave guide are separated from each other by an optical distance less than a quarter wavelength distance.

7. The guided light source according to claim 1, in which the at least one quantum box is arranged in the discoid wave guide.

8. The guided light source according to claim 1, in which the at least one quantum box and the discoid wave guide are separated from each other by an optical distance less than a quarter wavelength distance.

9. The guided light source according to claim 8, in which the annular wave guide is made of doped semiconductor material.

10. The guided light source according to claim 8, in which the annular wave guide is a rib wave guide.

11. The guided light source according to claim 9, further comprising an electrical contact pad arranged above the at least one quantum box.

12. The guided light source according to claim 1, in which the at least one quantum box is a single quantum box.

13. A method of emitting a sequence of single photons, comprising exciting the single quantum box of the source according to claim 12 by optical or electrical pumping.

14. A method of fabrication of a guided light source, comprising:

forming a discoid wave guide, an annular wave guide surrounding the discoid wave guide and being open at two coupling ends and an output wave guide optically coupled to the annular wave guide;

positioning at least one quantum box with respect to the discoid wave guide to achieve cylindrical propagation of a wave front emitted by the at least one quantum box in the discoid wave guide;

forming a grating coupler on an internal periphery of the annular wave guide to receive said wave front in normal incidence; and forming a coupler having a first side connected to the two coupling ends of the annular wave guide and a second side connected to the output wave guide, said coupler being configured to combine a beam circulating in the annular wave guide in a propagation mode and a beam circulating in the annular wave guide in a counter-propagation mode into a single beam circulating in the output wave guide.

* * * * *